United States Patent [19]
Laurx

[11] Patent Number: 5,993,252
[45] Date of Patent: Nov. 30, 1999

[54] SUPPORT ASSEMBLY FOR BOARD-MOUNTED ELECTRICAL APPLIANCE

[75] Inventor: John C. Laurx, Aurora, Ill.

[73] Assignee: Molex Incorporated, Lisle, Ill.

[21] Appl. No.: 08/956,579

[22] Filed: Oct. 23, 1997

[51] Int. Cl.⁶ .................................................... H01R 13/73

[52] U.S. Cl. .......................................... 439/573; 439/564

[58] Field of Search .................................... 439/564, 571, 439/572, 573, 567

[56] References Cited

U.S. PATENT DOCUMENTS

| | | | |
|---|---|---|---|
| 5,334,049 | 8/1994 | Kachlic et al. | 439/552 |
| 5,419,712 | 5/1995 | Bellomo et al. | |
| 5,423,691 | 6/1995 | Pickles | |
| 5,525,064 | 6/1996 | Mowry | 439/573 |
| 5,730,619 | 3/1998 | Hamlin | 439/573 |
| 5,829,601 | 11/1998 | Yurchenco et al. | 211/41.17 |

FOREIGN PATENT DOCUMENTS

WO 98/54939  12/1998  WIPO ............................. H05K 7/14

OTHER PUBLICATIONS

Molex Drawing Nos. SD–73739–001 (2 sheets), E–73739–005, E–73739–006.

*Primary Examiner*—Paula Bradley
*Assistant Examiner*—Katrina Davis
*Attorney, Agent, or Firm*—Robert J. Zeitler; Charles S. Cohen

[57] ABSTRACT

A support assembly is provided for mounting an electrical appliance on a printed circuit board. The assembly includes a supporting structure for mounting on top of the printed circuit board and a securing structure for mounting on the bottom of the printed circuit board. The structure extends through the board so that the structures sandwich the board therebetween. The securing structure is a one-piece plastic component including a body portion juxtaposed at the bottom of the board and a pair of spaced apart externally threaded stud portion projecting through appropriate holes in the board. The supporting structure includes a bracket for mounting the electrical appliance and a socket rotatably capturing a nut for threadably receiving the threaded stud portion of the securing structure. The socket has resiliently expandable side walls for snappingly receiving and capturing the nut therein.

11 Claims, 6 Drawing Sheets

SUPPORT ASSEMBLY FOR BOARD-MOUNTED ELECTRICAL APPLIANCE

FIELD OF THE INVENTION

This invention generally relates to the art of electrical connector or appliance mounting devices and, particularly, to a support assembly for mounting an electrical appliance on a printed circuit board.

BACKGROUND OF THE INVENTION

A wide variety of hardware, framework, support structures and the like are used to mount electrical connectors, electronic components and other electrical appliances on printed circuit boards. For instance, various structures are used to mount rather large microprocessor modules or cartridges on the top surface of a printed circuit board (motherboard) of computers such as personal computers.

An inherent problem in mounting microprocessor modules on printed circuit boards in computers or the like is that the modules are relatively large and heavy in comparison to other smaller electronic components, connectors and the like which are mounted on the board. Consequently, the support assembly for mounting the module on the board is large, unduly expensive and comprises multiple components.

For instance, a known support assembly includes a supporting structure disposed on top of the printed circuit board and a securing structure on the bottom of the board, with the structures being interconnected through the board. The bottom securing structure is a multi-component subassembly which includes at least a body portion usually fabricated of plastic material and a plurality of separate metal, externally threaded studs which project through holes in the board from the bottom to the top surface thereof. The supporting structure for the microprocessor module on top of the board also is a multi-component subassembly which includes an elongated support bracket with separate nuts for threadingly engaging the threaded studs extending through the board from the bottom securing structure. Still further components, such as separate metal clips, are used to hold the nuts on the bracket of the top supporting structure. All of these separate components of the supporting and securing structures of the support assembly add significantly to the manufacturing and assembly costs of the overall support arrangement. The present invention is directed to solving these problems by providing a much simpler and less expensive support assembly of the character described, particularly involving considerably fewer components than the prior art described above.

SUMMARY OF THE INVENTION

An object, therefore, of the invention is to provide a new and improved support assembly for mounting an electrical appliance on a printed circuit board.

In the exemplary embodiment of the invention, the support assembly includes a supporting structure for mounting on top of the printed circuit board and a securing structure for mounting on the bottom of the printed circuit board. The structures are interconnected through the board to sandwich the board therebetween.

The invention contemplates that the bottom securing structure be a one-piece component including a body portion juxtaposed against the bottom surface of the board and at least one externally threaded stud portion projecting through an appropriate hole in the board. The top supporting structure includes means for mounting the electrical appliance and a socket rotatably capturing a nut for threadably receiving the threaded stud portion of the securing structure.

As disclosed herein, the one-piece securing structure is unitarily molded of plastic material and includes an integral latch for interengaging the printed circuit board to hold the securing structure in position with the stud portion projecting through the hole in the board. Preferably, the integral latch is provided by a hooked cantilevered latch arm projecting through the hole alongside the stud portion.

The nut-receiving socket of the supporting structure has resiliently expandable side walls for snappingly receiving and capturing the nut therewithin. The resiliently expandable side walls have ribs which define a mouth slightly smaller than the dimensions of the nut to allow the nut to be snapped through the mouth, past the ribs and into the socket. The socket is generally cylindrical and includes at least one circumferential flange for engaging a shoulder on the nut to capture the nut axially within the cylindrical socket.

In the preferred embodiment, the top supporting structure is elongated to define opposite ends. One nut-receiving socket and captured nut is provided on each opposite side of each opposite end of the elongated supporting structure. A pair of the bottom securing structures are provided, one for each end of the top supporting structure, and with the securing structure including a pair of stud portions projecting through the printed circuit board for threadedly engaging the pair of nuts captured at each opposite end of the top supporting structure.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
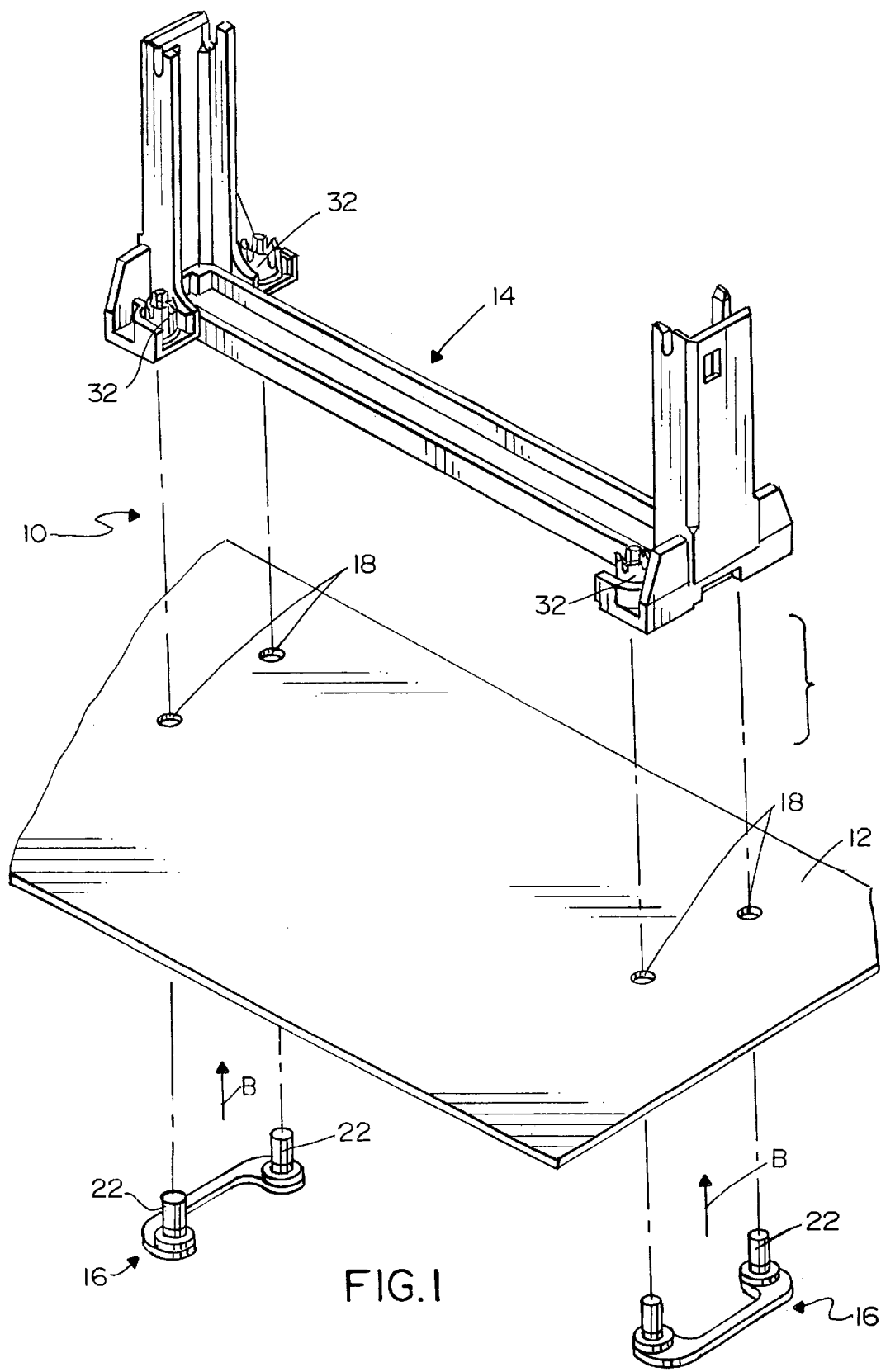
FIG. 1 is an exploded perspective view of the support assembly of the invention in conjunction with a printed circuit board on which the assembly is secured.

Referring to the drawings in greater detail, and first to FIG. 1, the invention is embodied in a support assembly, generally designated 10, for mounting an electrical appliance on a printed circuit board 12. Specifically, the support assembly is adapted for supporting and mounting a thin box-like microprocessor module or cartridge (not shown) on the printed circuit board. Generally, support assembly 10 includes a top supporting structure, generally designated 14, disposed on top of the printed circuit board and a pair of bottom securing structures, generally designated 16, disposed on the bottom of the board. The supporting and securing structures 14 and 16, respectively, are interconnected through the board to sandwich the board therebetween, as described in greater detail hereinafter. The printed circuit board has a pair of mounting holes 18 located proximate the opposite ends of top supporting structure 14, with one pair of mounting holes being provided for each of the bottom securing structures 16.

Figure 2:
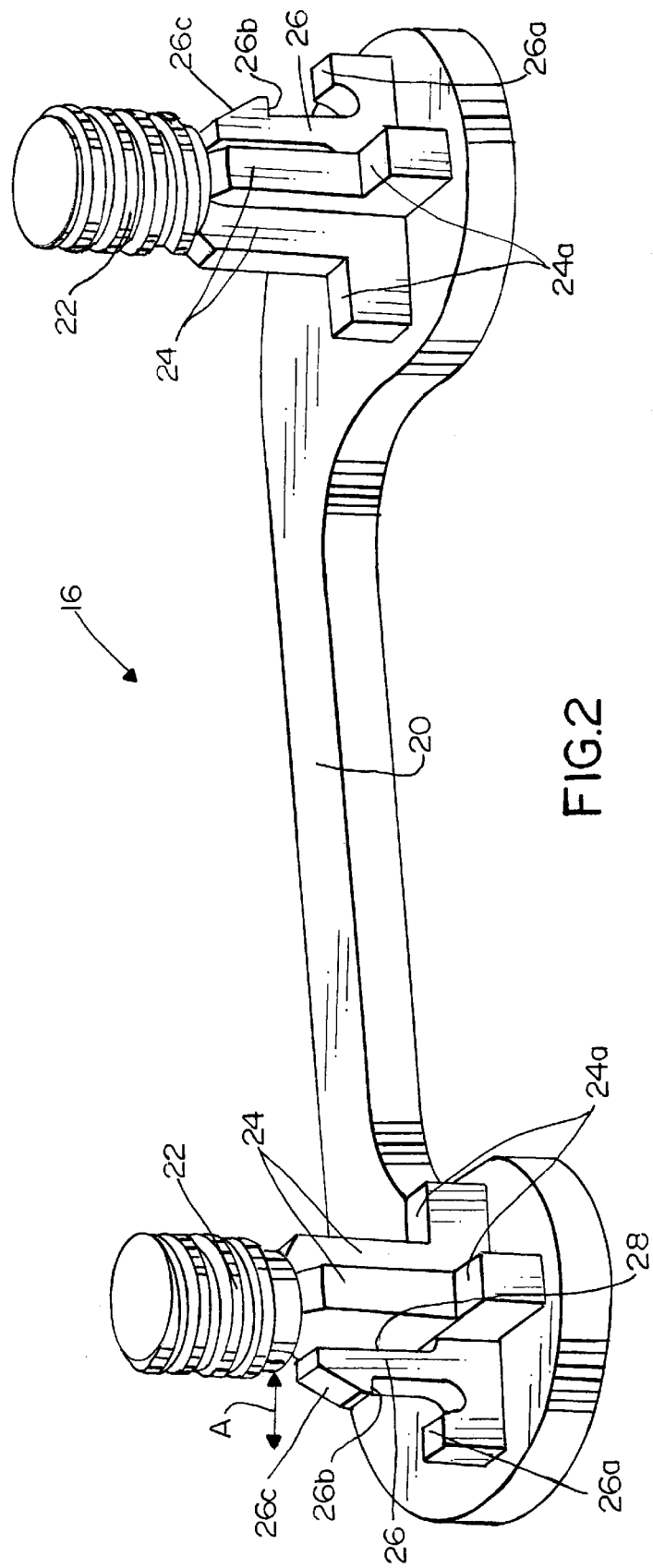
FIG. 2 is a perspective of one of the bottom securing structures of the assembly.

More particularly, referring to FIG. 2 in conjunction with FIG. 1, each bottom securing structure 16 is a one-piece component unitarily molded of plastic material or the like. The securing structure includes a body portion 20 which joins or bridges a pair of spaced apart, upstanding externally threaded stud portions 22. The externally threaded stud portions are raised above body portion 20 by integral L-shaped brace portions 24 defining upwardly facing shoulders or surfaces 24a. There are three brace portions 24 equally spaced about three sides of stud portion 22. A flexible, cantilevered latch arm 26 extends upwardly alongside the stud portion on the fourth side thereof. Another upwardly facing shoulder or surface 26a is disposed radially outwardly of flexible latch arm 26. As seen clearly in FIG. 2, cantilevered latch arm 26 is spaced outwardly from the stud portion, as at 28, so that the latch arm can flex in the direction of double-headed arrow "A." The latch arm has an outwardly projecting hook 26b.

Figure 8:
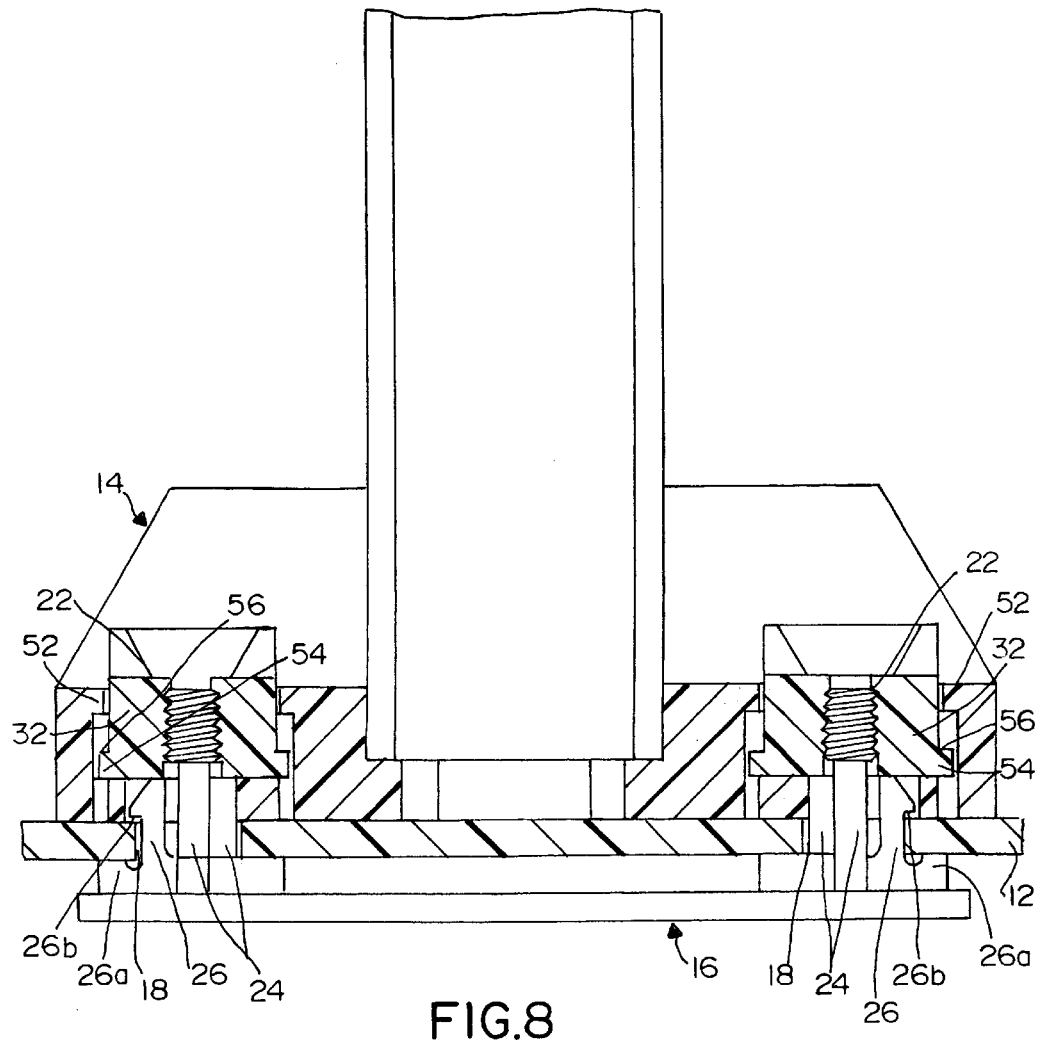
FIG. 8 is a cross-sectional view of the top supporting structure, the printed circuit board and the bottom securing structure in assembly.

In assembly, bottom securing structures 16 are oriented to align externally threaded stud portions 22 with mounting holes 18 in printed circuit board 12 as seen in FIGS. 1 and 8. The securing structures are moved upwardly in the direction of arrows "B", moving stud portions 22 through the mounting holes and forcing brace portions 24 and flexible latch arms 26 through the mounting holes. The flexible latch arms flex radially inwardly to pass through the holes. To that end, the distal ends of the latch arms are chamfered, as at 26c, to engage the edges of the mounting holes to bias the flexible latch arms inwardly. When hooks 26b on the latch arms clear the top surface of printed circuit board 12, the latch arms snap back outwardly with hooks 26b overlying the top surface of the board. When the bottom securing structures are fully assembled, upwardly facing shoulders or surfaces 24a and 26a are juxtaposed against the bottom surface of the board, and hooks 26b of latch arms 26 are juxtaposed with the top surface of the board.

Figure 3:
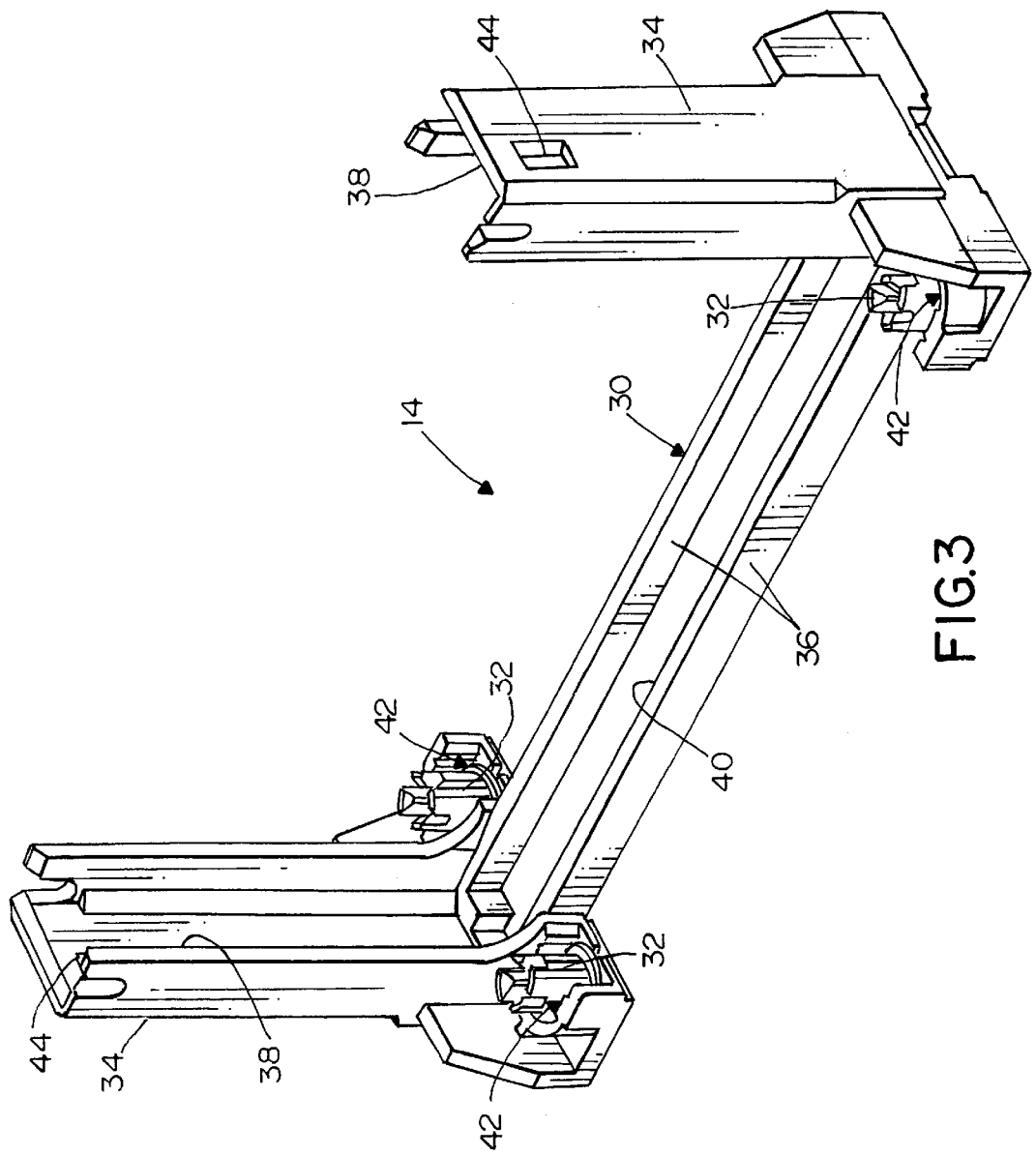
FIG. 3 is a perspective view of the top supporting structure of the assembly.

Referring to FIG. 3 in conjunction with FIG. 1, top supporting structure 14 is an elongated component which includes a one-piece body component, generally designated 30, unitarily molded of plastic material or the like, along with four internally threaded nut components 32. Body 30 of supporting structure 14 is generally U-shaped to define a pair of longitudinally spaced, upstanding leg portions 34 and a lower bight portion defined by a pair of laterally spaced rails 36. The upstanding leg portions, themselves, are generally U-shaped in cross-section to define a pair of inwardly opening, vertical channels 38. The bottom laterally spaced rails 36 define a horizontal slot 40. Four nut-receiving sockets, generally designated 42, are provided on body 30 of upper supporting structure 14. One socket is provided generally adjacent each lower corner of the body portion. The sockets are configured to rotatably capture nuts 32 therewithin.

In use, horizontal slot 40 between laterally spaced rails 36 at the bottom of supporting structure 14 is sized and shaped for embracing or surrounding an elongated electrical connector (not shown) which is secured and electrically connected to printed circuit board 12 before supporting structure 14 is mounted to the board. For instance, the terminals of the connector are solder-connected to circuit traces on the printed circuit board. This typically is done before support assembly 10, including bottom securing structures 16 and top supporting structure 14, are mounted to the board. Vertical channels 38 in upright leg portions 34 of supporting structure 14 then provide a structure within which the elongated, box-like microprocessor module can be inserted downwardly thereinto. A leading edge of the module mates with the connector located within horizontal slot 40 between rails 36. Latch apertures 44 may be provided in leg portions 34 for receiving appropriate latches on the microprocessor module to hold the module downwardly within vertical channels 38, in electrical engagement with the connector in horizontal slot 40.

Figure 4:
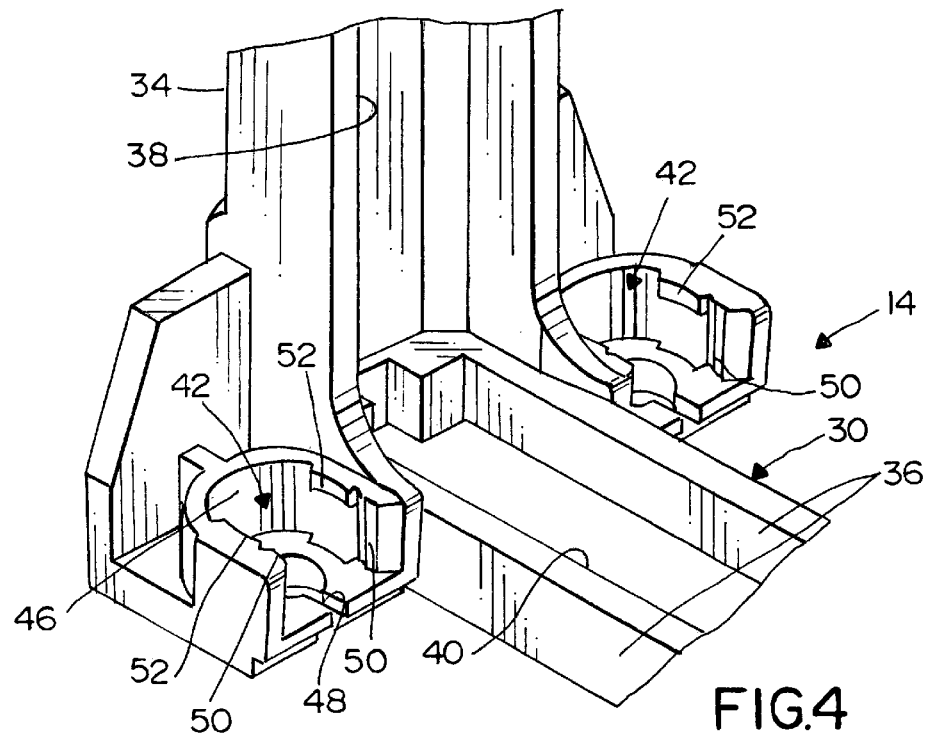
FIG. 4 is a fragmented, enlarged perspective view of one end of the top supporting structure, illustrating the two nut-receiving sockets thereat.
Figure 5:
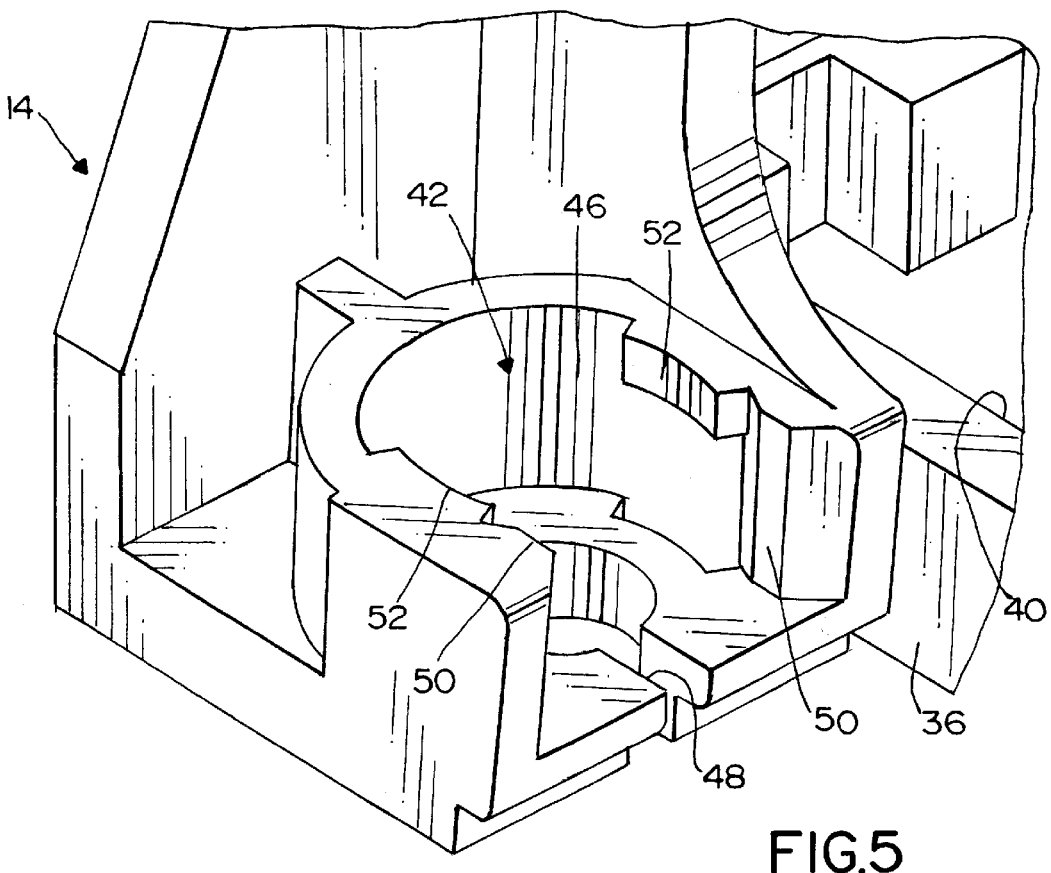
FIG. 5 is a further enlarged, fragmented perspective view of one of the nut-receiving sockets.
Figure 6:
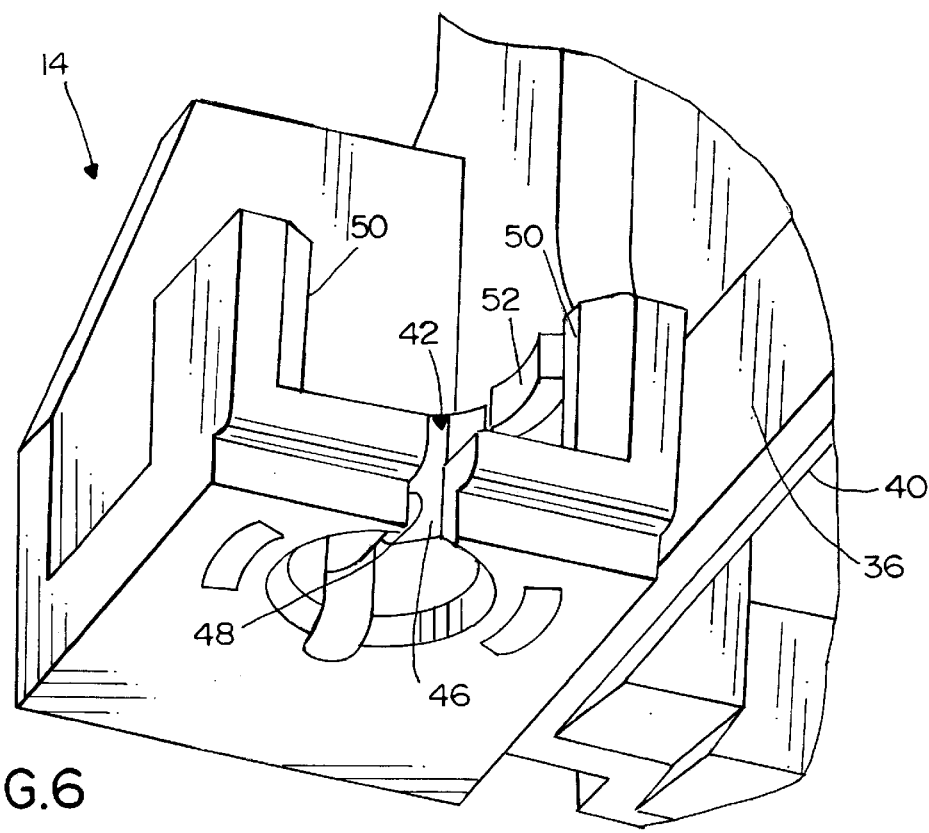
FIG. 6 is a view similar to that of FIG. 5, but looking upward toward the bottom of the socket.

FIGS. 4–6 show in greater detail the structure of each of the sockets 42 in upper supporting structure 14 for rotatably capturing one of the nuts 32. More particularly, each socket 42 is generally cylindrical and includes resiliently expandable side walls 46. The side walls are made expandable by a radially extending slot 48 extending through the lower wall of the socket. A pair of vertically extending ribs 50 define a mouth to the interior of the socket in a radial direction. The width of the mouth (i.e., the spacing between the vertical ribs) is slightly smaller than the diameter of the nut (as described hereinafter) to allow the nut to be snapped horizontally or transversely through the mouth, past ribs 50 and into socket 42. In addition, each cylindrical socket 42 has a pair of diametrically opposed, inwardly projecting circumferential flanges 52 which are sized and shaped for engaging a shoulder 56 on the nut 32 to capture the nut axially within the cylindrical socket. Therefore, vertical ribs 50 at the mouth in the resiliently expandable side walls of the socket allow for the nut to be snapped into and retained radially within the socket, while circumferential flanges 52 prevent the nut from moving axially out of the socket.

Figure 7:
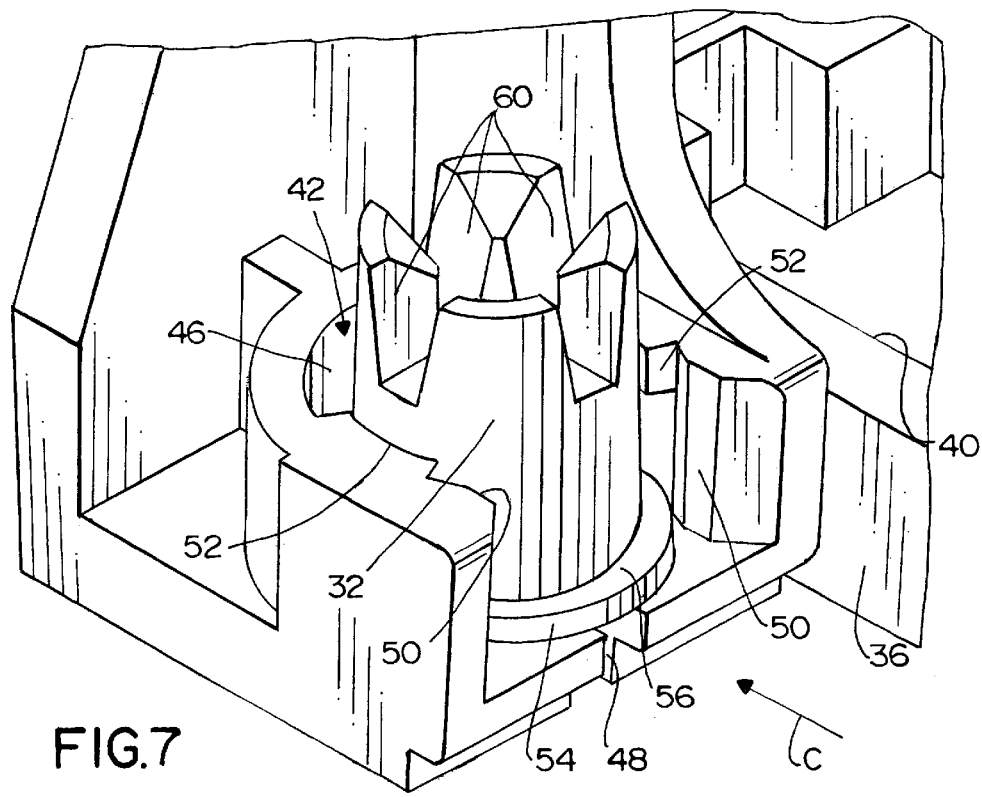
FIG. 7 is a view similar to that of FIG. 5, with one of the nuts snapped into the socket.

FIG. 7 shows one of the nuts 32 rotatably captured within one of the cylindrical sockets 42. The nut is generally cylindrical and internally threaded and includes a bottom circumferential flange 54. The flange projects radially outwardly of the nut to define a circular, upwardly facing shoulder 56. The nut is assembled into the socket in the direction of arrow "C." The diameter of flange 54 is slightly greater than the width of the mouth of the socket as defined by the distance between vertically extending ribs 50. Therefore, the flange and, thereby, the nut are snappingly captured within the socket in a radial direction. The nut cannot be moved axially out of the socket because upwardly facing shoulder 56 of flange 54 will abut against the bottom of inwardly projecting flanges 52 at the top of the socket. The nut is thus rotatably captured within the socket. Each nut may be provided with means for engaging an appropriate tool for rotating the nut to threadedly engage one of the externally threaded studs 22 of one of the bottom securing structures 16. As disclosed herein, the top of each nut 32 is provided with radial slits 60 (FIG. 7) for receiving the head of a screwdriver or the like.

It should be understood that such terms as "top", "bottom", "upwardly", "horizontally", "vertically", and the like herein and in the claims hereof have been used to provide a clear and concise understanding of the invention, only. Such terms are not in any way to be construed as limiting, because the support assembly obviously is omni-directional in use.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

I claim:

1. A support assembly for mounting an electrical appliance on a printed circuit board, comprising:

an elongated supporting structure for mounting on top of the printed circuit board and a securing structure for mounting on the bottom of the printed circuit board, the structures being interconnected through the board to sandwich the board therebetween;

said securing structure being a one-piece plastic component including a body portion for positioning at the bottom of the board and a pair of spaced apart externally threaded stud portions projecting from said body portion, said pair of spaced apart externally threaded stud portions projecting through respective holes in the board and;

an integral latch extending from said body portion and proximate each of said stud portions for interengaging the printed circuit board to hold the securing structure in position with the stud portions projecting through the holes in the board; and said supporting structure including means for mounting the electrical appliance and a plurality of sockets, each rotatably capturing a nut for threadably receiving one of the externally threaded stud portions of the securing structure, each said socket having resiliently expandable side walls for snappingly receiving and capturing the nut therewithin.

2. The support assembly of claim 1 wherein said integral latch comprises a latch hook projecting through the hole alongside the stud portion.

3. The support assembly of claim 2 wherein said latch hook comprises an integral hooked cantilevered latch arm.

4. The support assembly of claim 1 wherein said resiliently expandable side walls of each socket have ribs which define a mouth slightly smaller than the dimensions of the nut to allow the nut to be snapped through the mouth, past the ribs and into the socket.

5. The support assembly of claim 4 wherein each said socket is generally cylindrical and includes at least one inwardly projecting, circumferential flange for engaging a shoulder on the nut to capture the nut axially within the cylindrical socket.

6. A support assembly for mounting an electrical appliance on a printed circuit board, comprising:

a supporting structure for mounting on top of the printed circuit board and a securing structure for mounting on the bottom of the printed circuit board, the structures being interconnected through the board to sandwich the board therebetween;

said securing structure being a one-piece component unitarily molded of plastic material and including a body portion juxtaposed at the bottom of the board, at least one externally threaded stud portion projecting from said body portion and adapted to extend through an appropriate hole in the board and an integral latch extending from said body portion and proximate said stud portion for interengaging the printed circuit board to hold the securing structure in position with the stud portion projecting through the hole in the board; and said supporting structure including means for mounting the electrical appliance and a socket rotatably capturing a nut for threadably receiving the externally threaded stud portion of the securing structure, the socket having resiliently expandable side walls for snappingly receiving and capturing the nut therewithin.

7. The support assembly of claim 6 wherein said securing structure includes a pair of said stud portions spaced apart, and said supporting structure includes a pair of spaced, rotatably captured nuts.

8. The support assembly of claim 6 wherein said integral latch comprises a latch hook projecting through the hole alongside the stud portion.

9. The support assembly of claim 8 wherein said latch hook comprises an integral hooked cantilevered latch arm.

10. The support assembly of claim 6 wherein said resiliently expandable side walls of the socket have ribs which define a mouth slightly smaller than the dimensions of the nut to allow the nut to be snapped through the mouth, past the ribs and into the socket.

11. The support assembly of claim 10 wherein said socket is generally cylindrical and includes at least one inwardly projecting, circumferential flange for engaging a shoulder on the nut to capture the nut axially within the cylindrical socket.

* * * * *